(12) United States Patent
DeLuca et al.

(10) Patent No.: US 8,945,429 B2
(45) Date of Patent: Feb. 3, 2015

(54) ELECTRICALLY CONDUCTING THIN FILMS AND METHODS OF MAKING SAME

(75) Inventors: Stephan DeLuca, Dunwoody, GA (US); Sitaraman Krishnan, Potsdam, NY (US)

(73) Assignee: Energy Materials Corporation, Norcross, GA (US)

( * ) Notice: Subject to any disclaimer, the term of this patent is extended or adjusted under 35 U.S.C. 154(b) by 257 days.

(21) Appl. No.: 13/444,354

(22) Filed: Apr. 11, 2012

(65) Prior Publication Data

US 2013/0270425 A1 Oct. 17, 2013

(51) Int. Cl.
H01B 1/12 (2006.01)

(52) U.S. Cl.
USPC ............ 252/501.1; 252/500; 252/521.5; 250/225; 257/40; 427/74; 106/31.92

(58) Field of Classification Search
CPC .......... H01B 1/12; H01B 1/124; H01B 1/125; H01L 51/44; H01L 27/14; H01L 31/02
USPC .............. 252/501.1, 500, 521.5; 250/225; 257/40; 427/74; 106/31.92
See application file for complete search history.

(56) References Cited

U.S. PATENT DOCUMENTS

| | | | |
|---|---|---|---|
| 4,554,093 A | 11/1985 | Aldissi | |
| 5,229,624 A | 7/1993 | Marks | |
| 7,709,055 B2 * | 5/2010 | Ober et al. | 427/240 |
| 7,763,687 B2 * | 7/2010 | Ober et al. | 526/110 |
| 7,887,790 B2 * | 2/2011 | Ober et al. | 424/78.09 |
| 8,192,843 B2 * | 6/2012 | Ober et al. | 428/421 |
| 8,515,232 B2 * | 8/2013 | Kambe et al. | 385/129 |
| 2004/0241480 A1 | 12/2004 | Fansler et al. | |
| 2006/0083854 A1 * | 4/2006 | Ober et al. | 427/240 |
| 2006/0108581 A1 * | 5/2006 | Ahn et al. | 257/40 |
| 2007/0053867 A1 * | 3/2007 | Ober et al. | 424/78.09 |
| 2007/0106040 A1 * | 5/2007 | Ober et al. | 526/160 |
| 2009/0020750 A1 * | 1/2009 | Doetz et al. | 257/40 |
| 2010/0176417 A1 | 7/2010 | Wang | |
| 2010/0243049 A1 * | 9/2010 | Leidholm et al. | 136/256 |
| 2010/0280201 A1 * | 11/2010 | Ober et al. | 526/265 |
| 2010/0286335 A1 | 11/2010 | Sone et al. | |
| 2011/0177343 A1 * | 7/2011 | Ober et al. | 428/421 |
| 2011/0259412 A1 | 10/2011 | Kim et al. | |

FOREIGN PATENT DOCUMENTS

| | | |
|---|---|---|
| WO | WO92/06503 | 4/1992 |
| WO | WO2008/155130 | 12/2008 |
| WO | WO 2008155130 A1 * | 12/2008 |
| WO | WO 2013 154896 A1 * | 10/2013 |

OTHER PUBLICATIONS

Basescu, Z.-X. et al. (1987). "High electrical conductivity in doped polyacetylene". Nature 327, 403-405.
Harrell K.J.S. and S. T. Nguyen (2001), Polyacetylene and its analogs: Synthesis and physical properties. In Handbook of advanced electronic and photonic materials and devices; H. S. Nalwa, ed., Academic Press: San Diego, CA; vol. 8, Chapter 3.
Keheller P.R. "Development and Characterization of Polyacetylene Thin Films" Thesis Proposal, Clarkson University, Department of Chemical and Biomolecular Engineering, Mar. 2010.
Miyasaki T. et al. "Structure Model of Poly-vinyl alcohol film uniaxially stretched in water and the role of crystallites on the stress-strain relationship" Macromolecules, 2007, 40(23) pp. 8277-8284.
Winokur M.J. (2007) Structure studies of Π- and σ-conjugated polymers. In Handbook of Conducting Polymers, Third Edition, T. A. Skotheim and J. R. Reynolds, eds., CRC Press: Boca Raton, FL; Chapter 17.
International Search Report for PCT/US2013/035206 mailed Aug. 8, 2013.

* cited by examiner

Primary Examiner — Douglas McGinty
(74) Attorney, Agent, or Firm — Greenberg Traurig, LLP; Chinh H. Pham; Natalie Salem

(57) ABSTRACT

The present invention relates conductive nanostructured copolymer materials, such as thin film. In particular, the nanostructured copolymer material comprises plurality of chains substantially parallel to each other, each conductive chain comprising a plurality of conductive polyacetylene polymer blocks positioned along the chain and a plurality of polar poly(vinyl alcohol) polymer blocks in between the polyacetylene polymer blocks to form a pattern of alternatively repeating polyacetylene polymer blocks and poly(vinyl alcohol) polymer blocks and a ratio of polyacetylene polymer to poly (vinyl alcohol) polymer to provide the nanostructured copolymer material with conductivity of at least 1 S/cm. In some aspects, the invention relates to photoelectric devices comprising a nanostructured copolymer material and capable to convert light to electrical current.

10 Claims, 9 Drawing Sheets

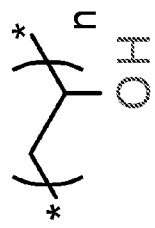
Fig. 1A
Poly(vinyl alcohol), PVA
Fig. 1B
cis-polyacetylene
Fig. 1C
trans-polyacetylene
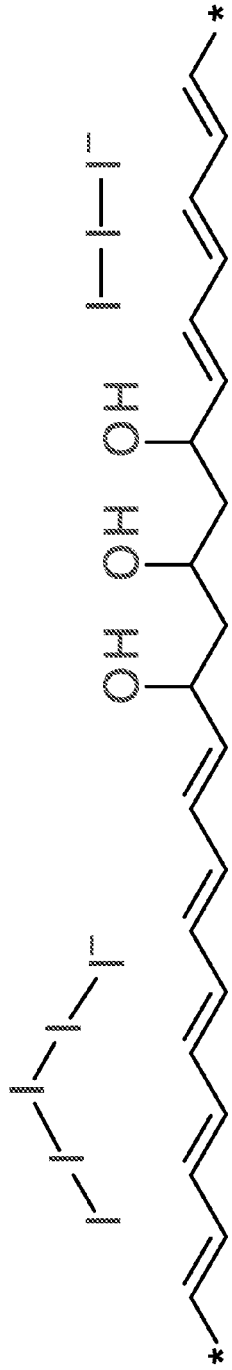
Fig. 1D
Poly(vinyl alcohol-co-acetylene) copolymer doped with iodine

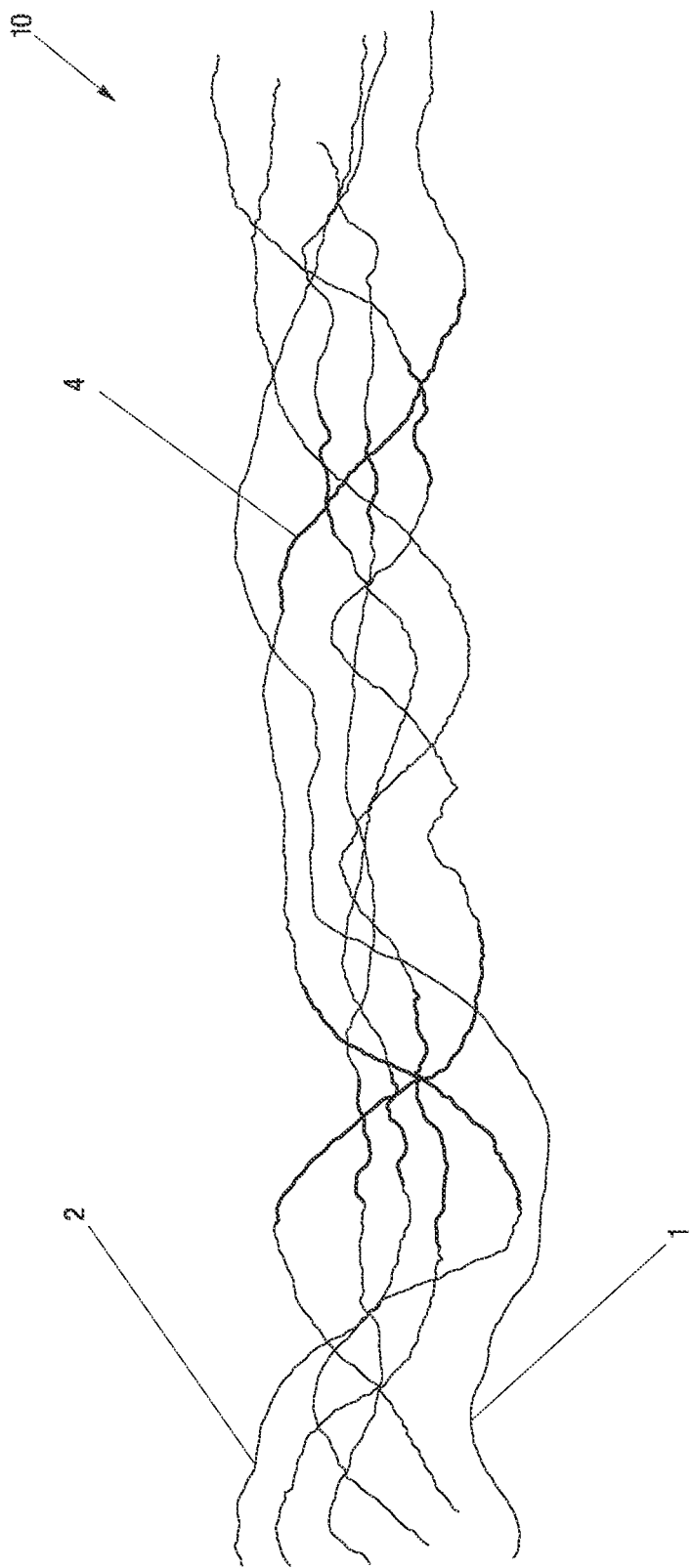

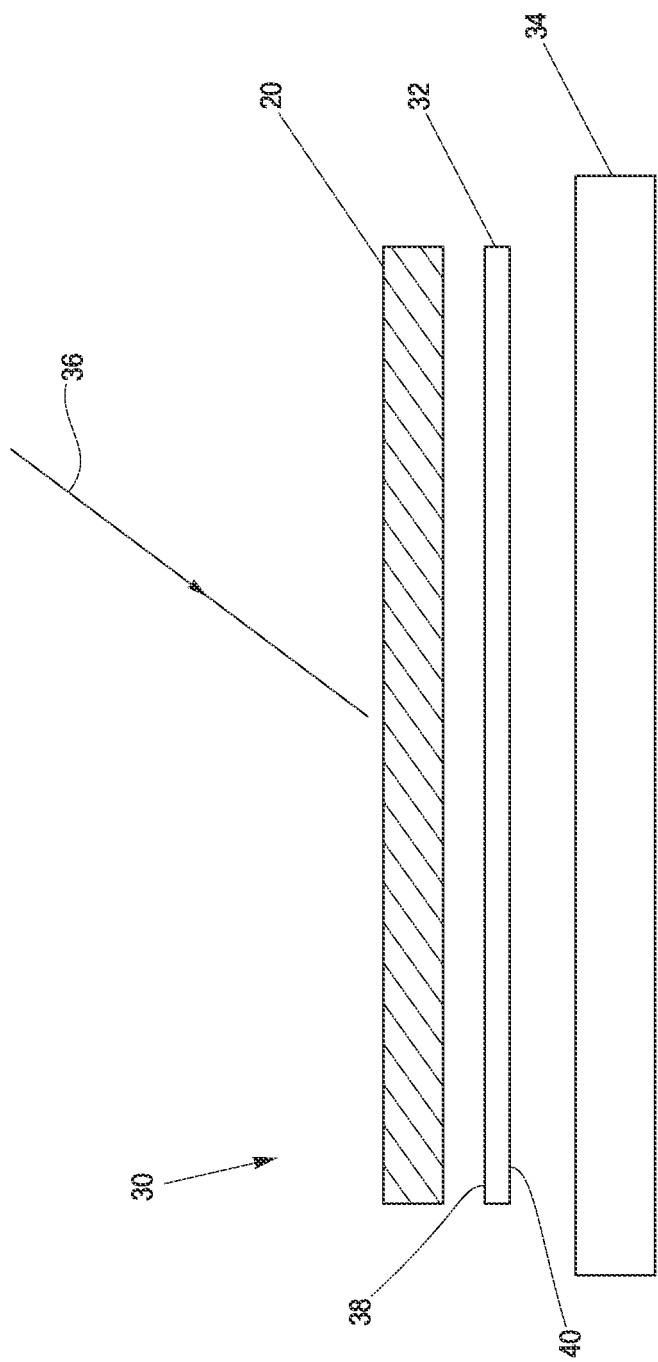

ELECTRICALLY CONDUCTING THIN FILMS AND METHODS OF MAKING SAME

TECHNICAL FIELD

The present invention relates to conductive nanostructured copolymer materials, such as copolymer chains, nanofibrils, or thin film and methods of making the same. In some aspects, the invention relates to photoelectric devices and methods of converting light to electrical current.

BACKGROUND ART

Photovoltaic technologies that can convert light into electricity is the fastest growing area for renewable energy. By contributing to renewable energy production, photovoltaic technologies are environmentally friendly and allow for the reduction of use of fossil fuels and reduction of formation of carbon dioxide.

Solar cells are generally made from inorganic materials such as metal and silicon-based semiconductor, and have a relatively limited power energy conversion varying from about 6 to 20%. Conventional inorganic conductors such as metals and semiconductors generally require multiple etching and lithography steps which can be expensive. As a result, the cost of the silicon solar cell technology may be prohibitive to impact the energy market. Therefore, a need remain for technologies that are a cost-effective alternative to fossil fuel-based power generation.

SUMMARY OF THE INVENTION

The present invention relates to a light polarizing conductive thin films and a manufacturing method thereof. Some aspects of the invention relate to copolymer photoelectric devices or solar cell and the manufacturing thereof. The copolymer photoelectric devices include conductive nanostructured copolymer materials such as a bundle of conductive copolymer chains or thin films having a plurality of copolymer chains.

Some aspects of the invention relate to a bundle of conductive fibrils comprising a plurality of conductive chains situated substantially parallel to one another, each having a plurality of conductive polyacetylene polymer blocks and a plurality of non-conductive poly(vinyl alcohol) polymer blocks in between the polyacetylene polymer blocks, positioned along the chain, to form a pattern of alternatively repeating polyacetylene polymer blocks and poly(vinyl alcohol) polymer blocks to permit electrical conductivity along the chain, a plurality of links formed by aggregation of the poly(vinyl alcohol) polymers on one chain to the poly(vinyl alcohol) polymers on an adjacent chain and a ratio of polyacetylene polymer to poly(vinyl alcohol) polymer that provides the conductive fibril bundle with a conductivity of at least 1 S/cm. In some embodiments, a plurality of links between adjacent chains is formed through polyiodine bridges.

Some aspects of the invention relate to conductive thin films comprising a member having opposing surfaces. The member can have a plurality of chains embedded within the member and being substantially parallel to one another, each conductive chain having (i) a plurality of conductive polyacetylene polymer blocks and a plurality of non-conductive poly(vinyl alcohol) polymer blocks in between the polyacetylene polymers along the chain to form a pattern of alternatively repeating polyacetylene polymer blocks and poly(vinyl alcohol) polymer blocks to permit electrical conductivity along the chain, and (ii) a plurality of links formed by aggregation of the poly(vinyl alcohol) polymers on one chain to the poly(vinyl alcohol) polymers on another chain and a ratio of polyacetylene polymer to poly(vinyl alcohol) polymer to provide the member with sufficient structural integrity while allowing for a conductivity of at least 1 S/cm or at least 10 S/cm or at least 100 S/cm. In some embodiments, the conductive thin film further comprises iodine. In some embodiments, a plurality of polyacetylene polymer blocks has a length of at least about 100 Å. In some embodiments, the lengths of the polyacetylene polymer blocks and the length of the poly(vinyl alcohol) blocks are random. The length of a plurality of polyacetylene polymer blocks can be at least about 10 Å and the length of a plurality of poly(vinyl alcohol) blocks can be between about 5 Å and about 50 Å. In some embodiments, the conductive thin film further comprises a plurality of molecular diodes along a length of the chain, each of the plurality of molecular diodes being spaced at least about 100 Å apart. Each diode can be formed by a polar electron deficient atom or group, such as a lithium ion, and a polar electron rich atom or group, such as a chloride ion, solvated and polarized in the poly(vinyl alcohol) islands.

Other aspects of the invention relate to a photoelectric device comprising a support, a light polarizing conductive thin film positioned on top of the support and capable of converting light to electric current, the thin film having member and a plurality of chains embedded within the member and being substantially parallel to one another and having a ratio of polyacetylene polymer to poly(vinyl alcohol) polymer to provide the member with a conductivity of at least 1 S/cm, each conductive chain having (i) a plurality of conductive polyacetylene polymer blocks and a plurality of non-conductive poly(vinyl alcohol) polymer blocks interdispersed in between the polyacetylene polymers along the chain to form a pattern of alternatively repeating polyacetylene polymers and poly(vinyl alcohol) polymers, and (ii) a plurality of links formed by the aggregation of the poly(vinyl alcohol) segments from one or more chains, and a plurality of substantially transparent interdigitated electrodes positioned against the member to allow for a substantially unidirectional electric current flow. The polarizing film can comprise iodine. In some embodiments, the photoelectric device further includes a plurality of molecular diodes. The diodes can have an electron donor group, a poly(vinyl alcohol) polymer and an electron acceptor group. The diodes can be aligned in a head to tail direction along a length of the chain. In some embodiments, the support can be insulating, flexible, or made from glass or transparent polymer. In some embodiments, the electrodes can be made from transparent conductive oxide. In some embodiments, the device can have a first plurality of electrodes having an end connected to a first busbar interdigitated with a second plurality of electrodes having an end connected to a second busbar and wherein the electrodes are oriented transverse to the length of the chains and contact the conductive polyacetylene polymers. In some embodiments, the device can be used as a photovoltaic cell, an infrared antenna, an infrared detector or in powering devices.

Some aspects of the invention relate to methods of converting light beam to electrical current using a polarizing thin film, allowing the light beam to hit the thin film, and converting light to electrical current. The polarizing thin film can have a plurality of chains having (i) a plurality of conductive polyacetylene polymer blocks and a plurality of non-conductive poly(vinyl alcohol) polymer blocks in between the polyacetylene polymer blocks along the chain to form a pattern of alternatively repeating polyacetylene polymer blocks and poly(vinyl alcohol) polymer blocks, and (ii) a plurality of links between the chains formed by aggregation of the poly(vinyl alcohol) polymers on one chain to the poly(vinyl alcohol) polymers on another chain. The plurality of chains can be substantially parallel to one another and having ratio of polyacetylene polymer to poly(vinyl alcohol) polymer to provide the thin film with a conductivity of at least about 1 S/cm or at least about 10 S/cm, or at least about 100 S/cm.

BRIEF DESCRIPTION OF DRAWINGS

The present disclosure is further described in the detailed description which follows, in reference to the noted plurality of drawings by way of non-limiting examples of exemplary embodiments, and wherein:

FIG. 1A-D is a schematic illustration of the single-chain structure of poly(vinylalcohol) polymer (PVA), cis and trans polyacetylene polymer (PA) and PVA-PA copolymer in accordance with one embodiment of the invention.

FIG. 2A is a schematic illustration of a PVA-PA copolymer fibril in accordance with one embodiment of the invention.

FIG. 6 illustrates a photoelectric device in accordance with one embodiment of the invention.

DESCRIPTION OF SPECIFIC EMBODIMENTS

Figure 2B:
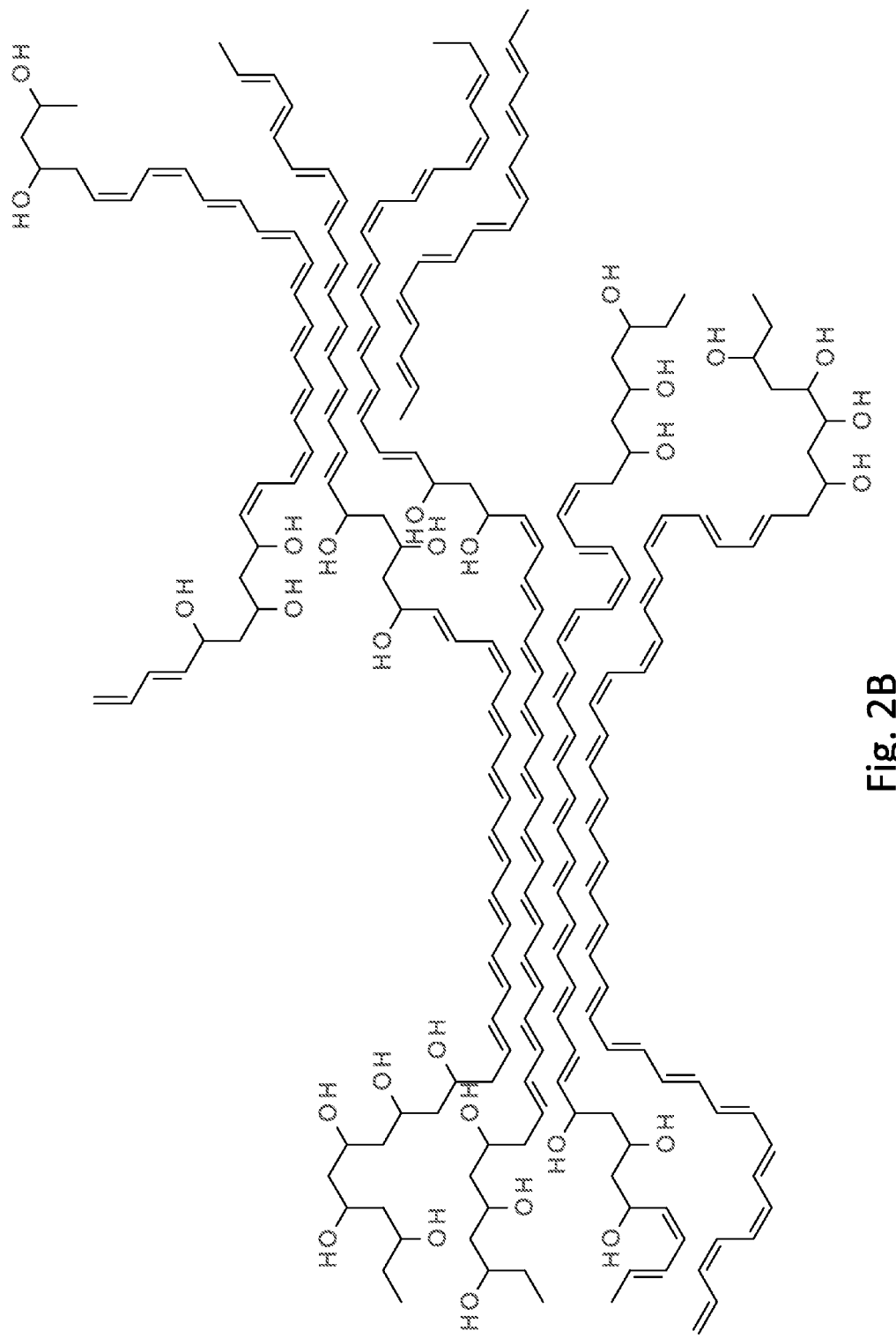
FIG. 2B is a schematic illustration of a PVA-PA copolymer showing crystalline domains of PA and aggregates of PVA.

There is an increasing interest in conductive organic polymers and devices using conductive organic polymers. Due to their low cost, as well as ease of fabrication and processing, these materials are being incorporated into numerous components including solar cells, printing electronic circuits, organic light emitting diodes, biosensors, electrochemical systems and microelectronic devices.

The present invention relates to a light polarizing nanostructured conductive copolymer materials. As used herein, copolymer materials refer to copolymer chains or chains, bundles of chains or fibrils and/or thin film unless specified otherwise. Other aspects of the present invention provide methods for the formation of such conductive copolymer materials. More particularly, the present invention provides nanostructured copolymer material having an extended length and capable of conducting electricity along its length. The nanostructured copolymer material can, in one embodiment, include iodine to improve its conductivity. In preferred embodiments, the nanostructured copolymer material may be a bundle of copolymer chains or a thin film formed by a plurality of copolymer chains and having a conductivity of at least 1 siemens/cm (S·cm$^{-1}$).

In preferred embodiments, the nanostructured copolymer material is a copolymer of poly(vinylalcohol) (PVA) insulator and polyacetylene (PA) conductor or semiconductor. As used herein, the term "polymers" refers to large, chainlike molecules consisting of numerous, smaller, repeating units called monomers. Generally, polymers can be synthesized by joining monomers together by addition, in which all the atoms in the monomer are present in the polymer, or by condensation, in which a small molecule byproduct is also formed. Functional polymers, such as polymers with advanced optic or electronic properties, may also be prepared by chemical modification of a precursor polymer.

Polyacetylene (PA)

Polyacetylene (PA) is a semi-conductive organic conjugated polymer and is hydrophobic and insoluble in water. PA has the advantage of having a high absorption coefficient (greater than $10^5 \cdot cm^{-1}$) and an electronic ($\pi$) band gap of about 1.5 eV at which optimum solar energy conversion efficiency can be attained.

PA can be characterized by the presence of a linear substructure alternating single bonds (C—C) and double bonds (C═C) (FIGS. 1B-C). Due to the conjugation (i.e. presence of double bonds), each carbon of the molecule is $\sigma$ bonded to one hydrogen and two sp$^2$ hybridized carbon atoms, and $\pi$ electrons (in the $p_z$ orbital of each C atom along the chain) are allowed to delocalize and be transported along the PA molecule. Undoped polyacetylene is a semiconductor, with filled valance band and empty conduction band, and a $\pi \rightarrow \pi^*$ transition energy in the range of 1.4 to 1.8 eV depending on the chain morphology [See M. J. Winokur (2007) Structure studies of $\pi$- and $\sigma$-conjugated polymers. In Handbook of Conducting Polymers, Third Edition, T. A. Skotheim and J. R. Reynolds, eds., CRC Press: Boca Raton, Fla.; Chapter 17]. As used herein, the term "doping" refers to the use of oxidizing or reducing agents (e.g., iodine or sodium, respectively) which causes insulator to metal transition and provides polyacetylene with a high electrical conductivity.

It has been shown that polyacetylene formed by conventional polymerization, is predominately in a cis form and that various treatments, such as elevated temperature, can convert the cis form of PA into a more stable, but brittle trans form of PA. The conversion of cis-PA to trans-PA can also occur because of doping. In some embodiments, polyacetylene can be doped by introduction of electrical positive or negative charges into the polymer (e.g. by oxidation or reduction). The doping process induces a partial cis/trans isomerization of the PA and has been previously shown to increase PA conductivity by several orders of magnitude. In particular, doping PA with iodine can increase the conductivity of PA from a conductivity typical for a semiconductor $10^{-3}$ S·cm$^{-1}$ to conductivity typical for metallic state, for example greater than 1 S·cm$^{-1}$. Maximum conductivity values exceeding 20,000 S·cm$^{-1}$ have been reported [See, N. Basescu, Z.-X. Liu, D. Moses, A. J. Heeger, H. Naarmann, N. Thiophilou (1987). High electrical conductivity in doped polyacetylene. Nature 327, 403-405]. The electrical conductivity results from mobile charge carriers introduced into the $\pi$-electron system by doping. Charge transport can occur not only along the conjugated chains, but also by inter-chain hopping. Conjugated polymer films, generally consist of regions that are crystalline and other regions that are disordered. Depending on the method of synthesis, crystalline domains of approximately 20 nm are commonly observed in the case of PA.

In some embodiments, PA can be synthesized by polymerization of acetylene in contact with a concentrated 4:1 mixture of triethylaluminum, AlEt$_3$, and titanium tetra-n-butoxide, Ti(OBu)$_4$ in toluene [Shirakawa technique, See K. J. S. Harrell and S. T. Nguyen (2001), Polyacetylene and its analogs: Synthesis and physical properties. In Handbook of advanced electronic and photonic materials and devices; H. S. Nalwa, ed., Academic Press: San Diego, Calif.; Chapter 3]. Yet other embodiments, PA can be synthesized using other techniques. For example, PA can be synthesized using the Naarmann technique which utilizes silicone oil as the solvent. Other techniques include elimination reactions on the polymer obtained by ring-opening metathesis polymerization of Feast's monomer, 7,8-bis(trifluoromethyl)tricycle[4.2.2.0]

deca-3,7,9-triene, (which is called the Durham route of PA synthesis), poly(vinyl acetate), poly(vinyl chloride), or poly(vinyl alcohol).

Poly(vinylalcohol) (PVA)

Poly(vinylalcohol) is a synthetic organic water-soluble polymer consisting of the —CH$_2$CH(OH)— monomer unit. PVA can be structurally characterized by the presence of uniquely single bonds and the presence of hydroxyl groups and hydrogen bonding between the hydroxyl groups (FIG. 1). The presence of uniquely single-bonds provides PVA with an insulating characteristic. The presence of hydrogen bonds provides PVA with certain unique properties such as crystallinity and high crystalline modulus.

PVA polymers are generally durable and resistant to abrasion, various chemical reagents (acids, alkali bases, oxidizers in moderate concentrations, low-polarity solvents, and petroleum products) as well as light. PVA has excellent film forming, emulsifying and adhesive properties. PVA polymers can also be mechanically stretched leading to stretch-oriented chains.

As provided in the present invention, PVA can be the starting substrate for the generation of poly(vinylalcohol)/polyacetylene (PVA-PA) copolymer material such as PVA-PA chains, bundles of PVA-PA copolymers chains (referred herein as fibrils or fibrils), and PVA-PA copolymer thin films.

In some embodiments, the chain of PVA-PA copolymer may be formed by reaction of hydroiodic acid (HI) with PVA. In particular, the HI acid can combine with the hydroxyl moieties of the PVA polymer, catalyze the dehydration of PVA and form carbon double bonds. Since the starting PVA polymer has hydroxyl groups on every other carbon atom of the polymer chain, the removal of adjacent hydroxyl groups leads to a conjugated system of double bonds characteristic of the PA polymers. The resulting copolymer chain can include a plurality of PA polymer blocks and a plurality of PVA polymer blocks interspersed within the chain, the PVA and PA polymer blocks or segments being linearly connected to each other. The combination and extent of the combination of conducting and insulating sections of the chain and the association of the copolymer chains can be engineered to provide for a copolymer material having a conductivity of at least 1 S·cm$^{-1}$. In some embodiments, conductivity of the nanostructured copolymer material is at least 10, at least 100, at least 1,000, at least 10$^4$ S·cm$^{-1}$, or at least 10$^5$ S·cm$^{-1}$. The conductivity of the copolymer material (e.g. fibril or thin film) can depend on a variety of parameters, such as, the ratio of the conducting and insulating sections of the nanostructured copolymer material (PA/PVA ratio), the length of the PA polymers, the length of the PVA polymer blocks in the copolymer chains as well as the intermolecular interactions between copolymer chains. In addition, the conductivity of the copolymer material (e.g. fibril or thin film) depends of the amount halogen, such as chlorine, bromine, or iodine present or added to the copolymer material.

According to some aspects of the invention, the PA/PVA ratio derives from the extent of the dehydration of the PVA starting material. In some embodiments, suitable reaction conditions can be chosen to provide for the appropriate degree of dehydration and to provide for the formation of individual copolymer chains or bundles of copolymer chains having predetermined PA/PVA ratios. For example, dehydration of the PVA can be about at least 70%, at least 80%, at least 85% or at least 90% complete. In some embodiments, dehydration can be between 75% and 80%, between 80% and 85%, between 85% and 90% or between 90 and 95%. The degree of dehydration is generally dependent on the reaction temperature. Accordingly, the temperature of reaction and the length of the reaction time can be chosen to provide for the desired degree of dehydration for the formation of copolymer material with the appropriate PA/PVA ratio. For example, the starting PVA material can be heated at temperatures ranging from about 120° C. to about 250° C., with higher amount of dehydration being associated with higher temperatures. For example, the PVA material can be heated at temperatures of about 120° C., about 130° C., about 140° C., about 150° C., about 160° C., about 170° C., about 180° C., about 190° C., about 200° C., about 210° C., about 220° C., about 230° C., about 230° C., about 240° C., or about 250° C. In addition, the temperature of reaction and the length of the reaction time can be chosen to provide for a thin film having sufficient structural integrity.

To dehydrate, according to some embodiments of the invention, the reaction can occur in open air. The reaction can also occur in an air-tight environment, in an air-tight environment with a non-reactive gas purge, or under vacuum conditions to minimize oxidation. Elevated reaction temperatures can enable rapid dehydration of the PVA into PA, although a more brittle copolymer may be formed. In addition, it should be noted that elevated temperatures can result in the crosslinking of adjacent polymer chains. It will be understood that crosslinking can reduce the conductivity of the copolymer due to the creation of crosslinks that are insulating. Accordingly, in some embodiments, the thin film or fibrils of PVA is preferably exposed to temperatures suitable for the formation of a thin film or fibril having a conductivity of at least 1 S·cm$^{-1}$ while maintaining the integrity of the nanostructured copolymer material and avoiding undesired side reactions.

In some embodiments, dehydration of the PVA can occur in presence of a strong acid, which can act as a catalyst. For example, films cast from a solution of PVA in ethanol-water mixture can be reacted with suitable concentration of hydroiodic acid (HI) to catalyze the dehydration reaction. Although HI acts as a catalyst and is only required in small amounts, HI is also volatile and leaves the polymer film at elevated temperatures needed to convert PVA to the PVA-PA copolymer. In some embodiments, for the dehydration reaction to be efficient, a ratio of HI to PVA should be 1:1 or 1:2 in order to retain enough HI in the film to effect the conversion. Alternatively, a smaller amount of HI may be used if the conversion is carried out in a closed system (i.e. where there is exchange of heat with the surroundings but no exchange of mass). The addition of HI at a suitable concentration to the starting PVA polymer before the dehydration process can result in for the formation of a copolymer material that includes iodine at an amount suitable to increase conductivity. In some embodiments, the iodine content of the copolymer material can be further increased by doping the dehydrated PA-PVA copolymers with iodine. In some embodiments, the transparent PVA polymer becomes yellow or brown depending on the amount of iodine complexed to the PVA. In other embodiments, the PVA is dehydrated in presence of a strong acid other than HI and the resulting PVA-PA copolymer material is doped with a halogen such as iodine.

In some embodiments, a solution comprising the PVA starting material can be cast on a casting belt, and partially dried. The PVA polymer can then be stretched to align the PVA polymer chains in a substantially parallel fashion. Stretching generally occurs in the amorphous region of the PVA and can increase the overall crystallinity of the PVA. Upon dehydration of PVA under appropriate conditions, a PVA-PA copolymer material can be formed wherein the PA polymer maintains the stretch orientation of the starting stretch-oriented PVA. The remaining hydrophilic PVA polymer sections on adjacent chains tend to aggregate or couple and form polar domains by stabilization due to hydrogen bonding interactions (FIG. 2). In some embodiments, the conductivity of the copolymer can be maximized by optimizing the PVA-PA mole ratio and the crystallinity of the copolymer since these two factors affect the extent of dehydration reaction and electrical conductivity of the resulting copolymer.

Figure 3A:
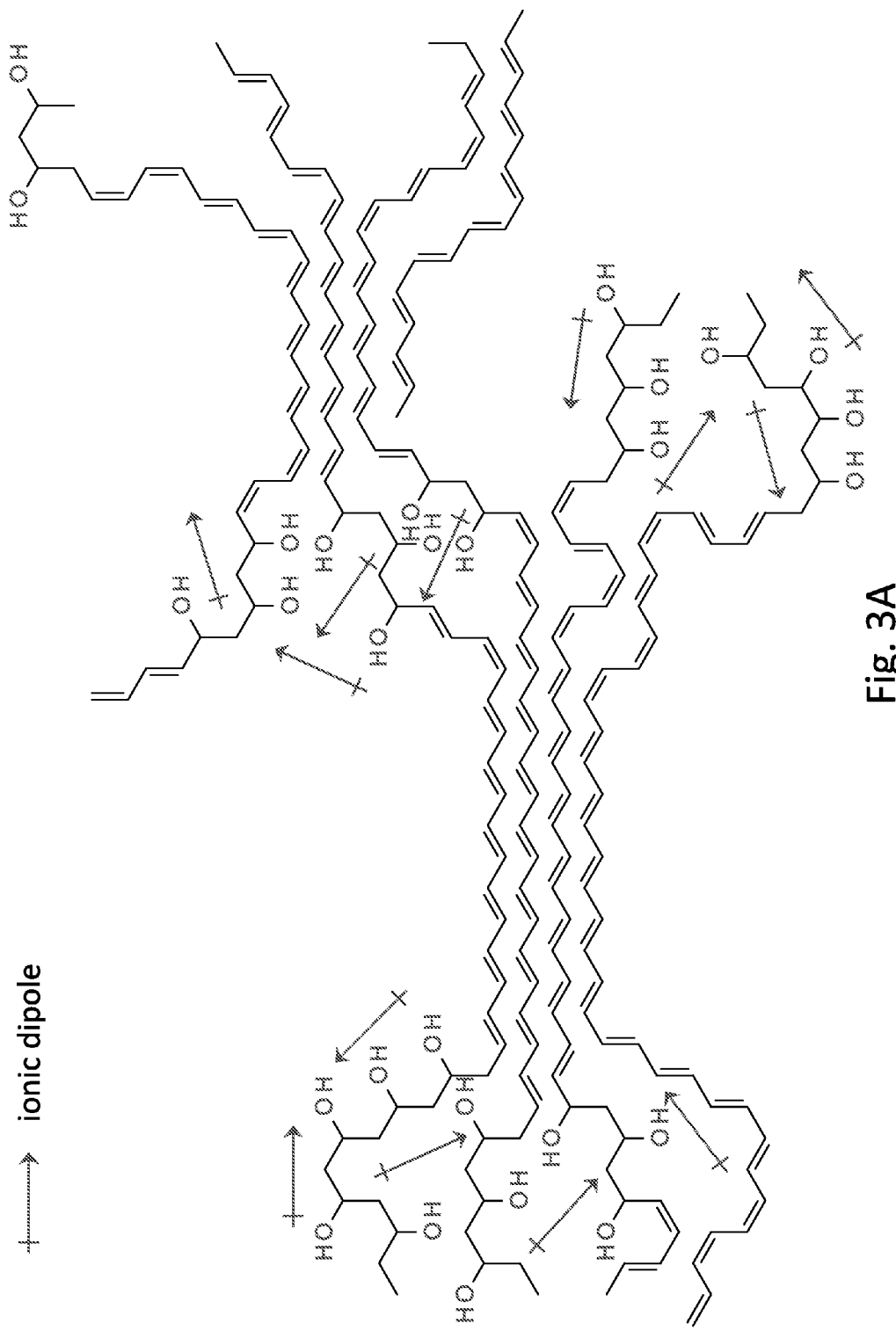
FIG. 3A-B is a schematic illustration of a PVA-PA copolymer before poling copolymer in accordance with one embodiment of the invention.
Figure 3B:
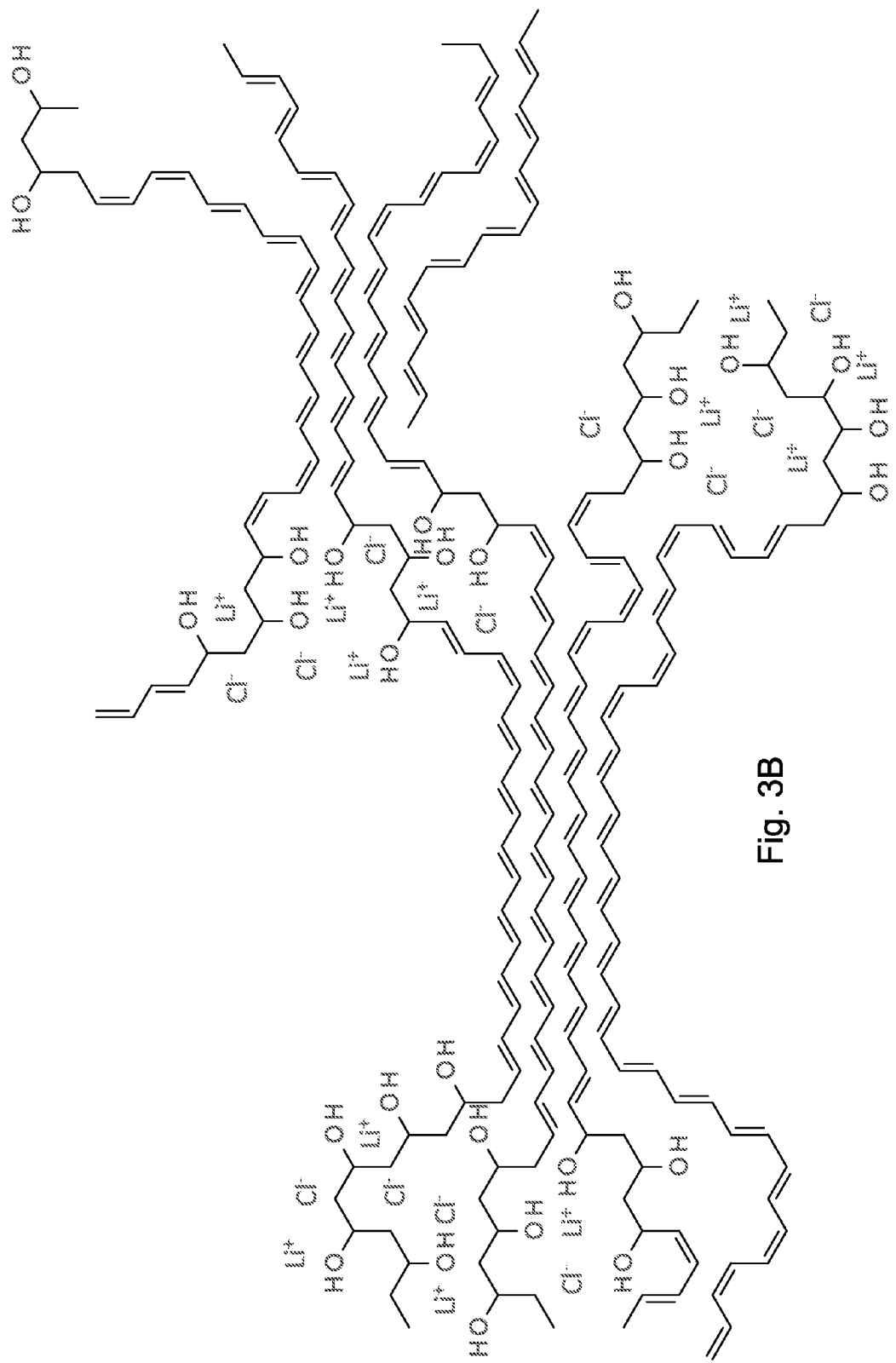
Figure 4A:
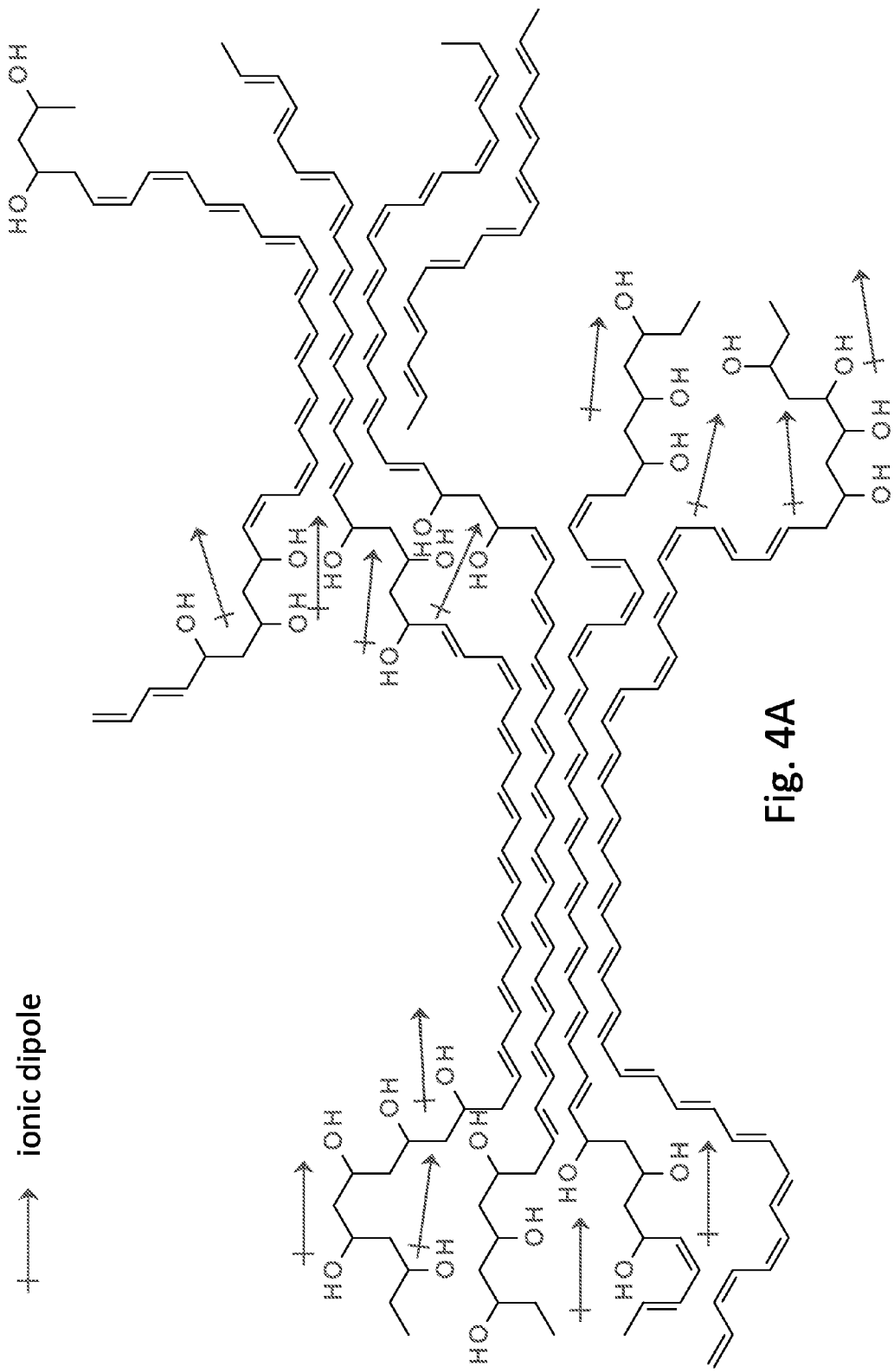
FIG. 4A-B is a schematic illustration of a PVA-PA copolymer fibril after poling copolymer in accordance with one embodiment of the invention.
Figure 4B:
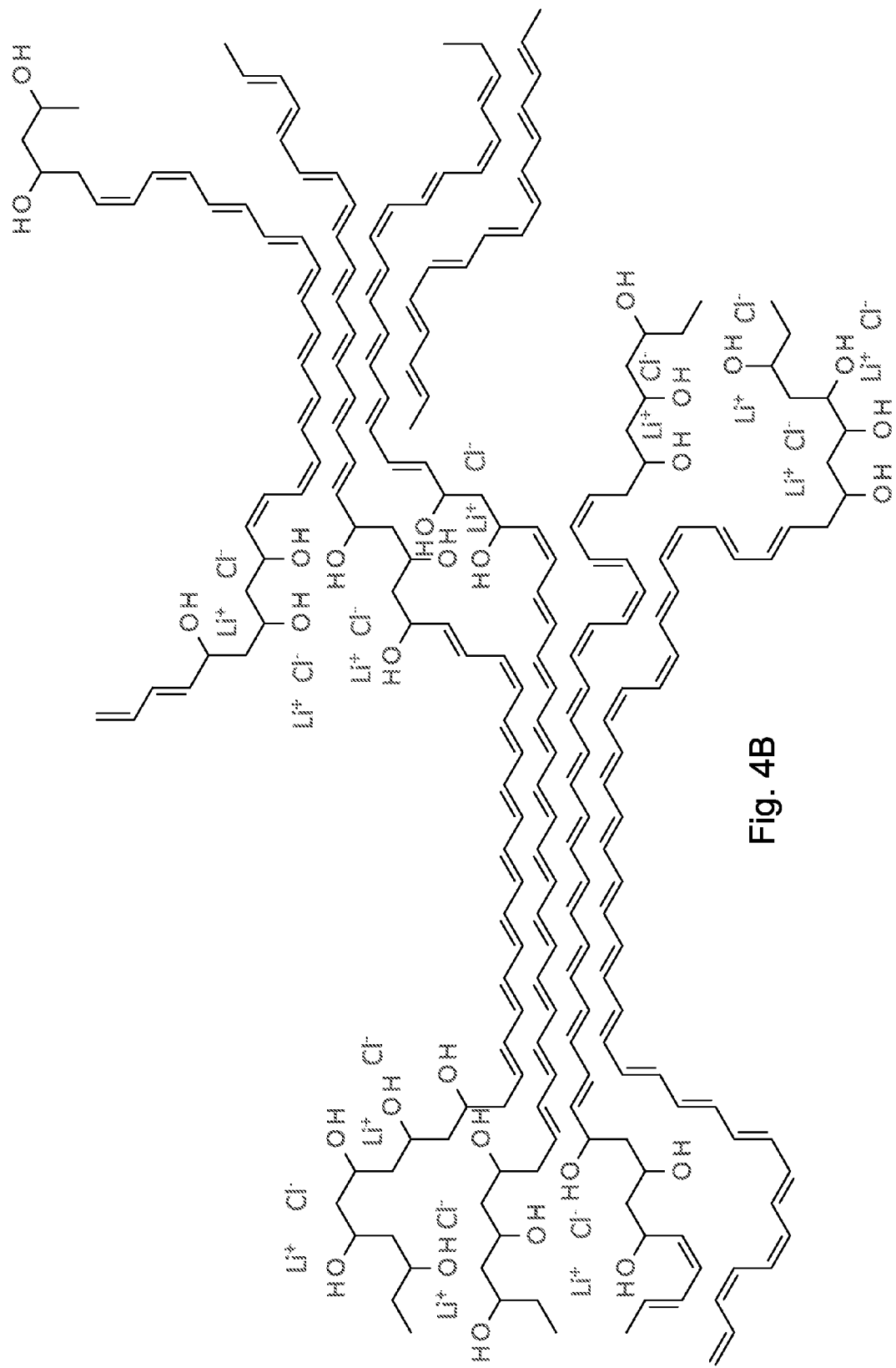

In some embodiments, alkali halide salts can be dissolved and added to the material, to form cation and anion pairs. In some embodiments, the alkali halide salt can be added to the starting PVA polymer. Yet in other embodiments, the alkali halide salt is added to the PVA-PA copolymer. In some embodiments, the alkali salt can include, but is not limited to, LiCl, LiBr, LiI, KCl, or KI. Due to the polar nature of PVA, the salts are solvated in the PVA domains of the PVA-PA copolymer although not in any particular orientation (FIG. 3A-B). Diodes can be formed by a polar electron deficient atom or group, such as lithium ion, and a polar electron rich atom or group, such as chloride ion, solvated and polarized in the poly(vinyl alcohol) islands. As used herein, "solvation" refers to the complexation of the electron deficient atom or group (or the electron rich atom or group) with the monomer units of the poly(vinyl alcohol) islands, resulting in stabilization of the solute species in the poly(vinyl alcohol) solvent. As used herein, the term "polarization" refers to the orientation of permanent (ionic or covalent) dipoles caused by an applied or induced electric field. In some embodiments, an array of electrodes can be disposed along the copolymer material length to create an electrical field and align the diodes in a direction parallel to the oriented PA chains in a poling process. The poling process can be used to separate and align the cations and anions, thereby forming oriented molecular diode structures (FIG. 4A-B). After poling the copolymer material, the electrodes can be removed and the poled PVA-PA copolymer can be dried.

PVA-PA Copolymer Chain

According to some aspects of the invention, PVA-PA chain comprises a plurality of relatively long polyacetylene polymer blocks and a plurality of relatively short poly(vinyl alcohol) polymer blocks linearly connected along the length of the chain to form a pattern of alternatively repeating conductive polyacetylene polymer blocks and non-conductive poly (vinyl alcohol) polymer blocks (FIG. 2). Copolymer fibrils or thin films can have a plurality of copolymer chains situated substantially parallel of one another. Each chain can have a plurality of PA polymer blocks along the chains and a plurality of PVA polymer blocks interspersed in between the PA polymers to form a pattern of alternatively repeating PA polymer blocks and PVA polymer blocks. The desired lengths distribution of the alternatively repeating PA and PVA polymer blocks is random. The desired length distribution of the PA polymer blocks is preferably suitable to absorb light (e.g. sunlight, visible light, or ultra-violet or infrared). For example, the length of the PA polymer blocks can be greater than about 100 Å, greater than about 200 Å, greater than about 300 Å, greater than about 400 Å, greater than about 500 Å, greater than about 600 Å, greater than about 700 Å, greater than about 800 Å or greater than about 900 Å. In some embodiments, the length of the PA polymer blocks can be random within the copolymer molecules and is able to absorb different light wavelengths, ranging from the IR to the UV spectrum. Yet, in other embodiments, the length of the PA polymer blocks can predetermined to absorb selected light frequencies. On the other hand, the desired length of the PVA polymer blocks can be engineered to allow for diode formation and/or tunneling of electrons. For example, the length of the PVA polymer blocks can be about 5 Å, about 10 Å, about 20 Å, about 30 Å, about 40 Å, about 50 Å, greater than about 50 Å or combinations thereof. The length of the PVA polymer blocks can be random within the ranges provided herein.

Doped PVA-PA Nanostructured Copolymer Material

It has been previously shown that organic polymers generally exhibit a conductivity ranging from the conductivity typical for insulator ($10^{-10}$ siemens per cm ($S \cdot cm^{-1}$) to semiconductor ($10^{-3}$ $S \cdot cm^{-1}$). In preferred embodiments, the PVA-PA copolymers chains, bundles of PVA-PA copolymers chains and PVA-PA copolymer thin films can be iodine doped to increase the conductivity of the nanostructured copolymer material. The iodine ($I^-$, $I_3^-$ or $I_5^-$) molecules may be held by the conjugated PA chains while the PA is formed during the dehydration process, the iodine being provided by HI and/or by further addition of iodine during the dehydration process. Yet in some embodiments, the iodine can be added after the dehydration process to the PVA-PA copolymer. The iodine can form polyiodide chains attached to the PVA and PA chains and can act as an additional conductive pathway.

Doping of polyacetylene films with donor or acceptor molecules allows for the partial addition (i.e. reduction, n-doping) or removal (i.e. oxidation, p-doping) of electrons to or from the π system of the polymer backbone. The resulting n-doping or p-doping is believed to result in charge transfer with the polyacetylene chain and not in direct chemical bond, and is known to increase the conductivity from conductivity typical for insulator to conductivity typical for metallic state (1 $S \cdot cm^{-1}$ to $10^4$ $S \cdot cm^{-1}$). In some instances, polyacetylene can be p-doped with an oxidizing agent such as iodine and the positive charges can be delocalized over the C—H units of the polyacetylene backbone to give a positive soliton.

Preferably, the PVA-PA copolymer may be stretch-oriented before doping resulting in a nanostructured copolymer material, such as a bundle or thin film, having a plurality of regions of stretch-oriented doped polyacetylene molecules. Accordingly, the PVA-PA nanostructured material can exhibit conductivities along the nanostructured material in the direction of stretching. In some embodiments, the copolymer nanostructured material can be doped with an appropriate amount of iodine to increase and obtain a conductivity of at least 1 $S \cdot cm^{-1}$. For example, the doped PVA-PA copolymer can have a conductivity of about 1 $S \cdot cm^{-1}$, about 10 $S \cdot cm^{-1}$, about 100 $S \cdot cm^{-1}$, about $10^3$ $S \cdot cm^{-1}$ or $10^4$ $S \cdot cm^{-1}$.

Nanostructured Copolymer Material Structure

Some aspects of the invention relate to a chain like molecular structure (also referred as chains) of alternating sections of insulating poly(vinylalcohol) and conductive polyacetylene copolymer. The PA polymer blocks can act as molecular antennas having a broad light spectrum absorption property and the PVA polymer blocks can act as insulating sections between the conducting antenna sections.

In some embodiments, the copolymers chains may be assembled in a substantially parallel fashion forming an array of copolymer chains. In some instance, the copolymer chains can be aligned substantially parallel to each other by stretching the fibril or the thin film (also referred herein as nanostructured copolymer materials). In some embodiments, the molecular copolymers chains can be connected in a substantially linear and substantially parallel fashion to form fibrils 10 (FIG. 2A). Adjacent copolymer chains can interact with each other, can be intertwined or can be wrapped around each other. In some embodiments, PVA sections of the adjacent chains can interact through hydrogen bonding and forming crystalline regions. Interacting copolymer chains can form bundles of chains (also referred as fibrils) or coherent thin films. The mechanical stretchability of PVA polymers can lead to stretch-oriented PVA-PA chains within the bundle or the thin film. The thin film can comprise non-woven chains of PVA-PA copolymers or woven chains of PVA-PA copolymers. The thin film can be porous or non-porous. Preferably, the PVA-PA copolymer comprises trans-PA and is doped with iodine.

Figure 5:
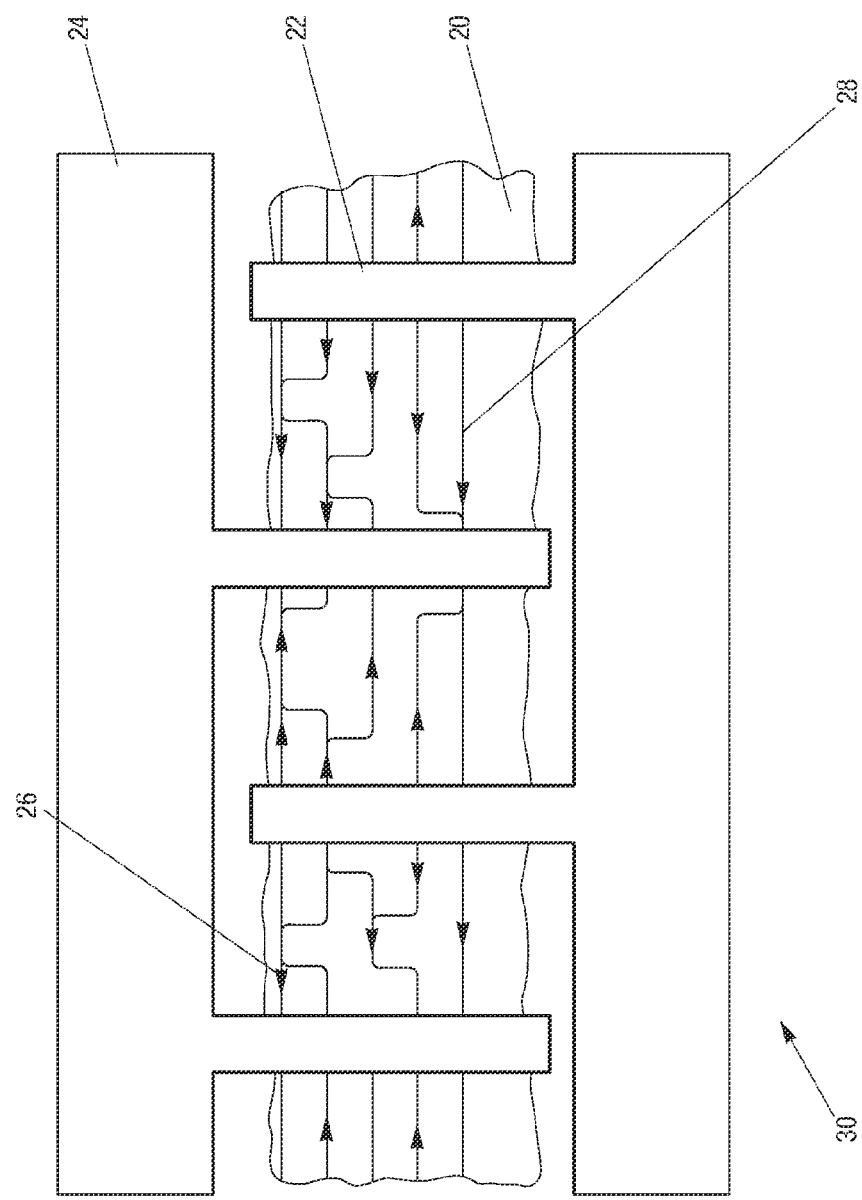
FIG. 5 illustrates a device in accordance with one embodiment of the invention.

In preferred embodiments, the thin film or bundle of copolymer chains 10 have an alternating pattern of regions of stretch-oriented PA polymer blocks 2 and stretch-oriented PVA insulator polymer blocks 4 forming hosting oriented molecular ionic dipoles 8. In some embodiments, the molecular ionic dipoles 8 can be located at the crystalline regions corresponding to the PVA sections 4 of the copolymer fibrils or thin films 10. These oriented ionic dipoles, which are built within the copolymer chain, are called "diodes" because they impart the property of unidirectional current flow to the conducting copolymer chains, fibrils, or films. The diodes 8 can comprise linearly oriented complexes of cations and anions with polar poly(vinyl alcohol), which are aligned along the stretch axis (FIG. 4A). The presence and orientation of ionic dipoles 8 will define an electrical current direction. Ionic dipoles 8 can be aligned using an electric field by applying to the copolymer material a potential across electrodes in a solution of acceptor and donor groups (e.g. LiCl, FIG. 4B). Referring to FIG. 5, molecular diodes 26 can be formed along the copolymer molecules in a head to tail orientation between adjacent electrodes 22, with the cationic groups on one side of the diodes and anionic groups on the opposite side of the diodes. Preferably, the spatial extent of the oriented ionic dipole clusters can be about 5 Å, about 10 Å, about 20 Å, about 30 Å, about 40 Å, about 50 Å, greater than 50 Å in length, or combination thereof. The oriented ionic dipoles create an electric field that directs the motion of a photoelectron. Therefore, the presence of oriented ionic dipoles or diodes allows for movement of the electrons in a single direction. The diodes may also increase the rate of separation of charge carriers generated by absorption of light, decrease the rate of charge recombination, and consequently increase the power conversion efficient of the solar cell. Exemplary anionic groups include, but are not limited to the chloride ion. Exemplary cationic groups include, but are not limited to, the lithium ion.

In some embodiments, the efficiency the nanostructured copolymer material can be correlated to the characteristics of the diodes such as the spatial distribution and the size of the diodes. Accordingly, the size and/or the spatial distribution of the diodes can be tuned to achieve a desired efficiency of the nanostructured copolymer material for a particular wavelength and/or downstream application.

In some embodiments, the spatial distribution, the size and the spacing of the polar PVA nanodomains can be determined by complexing the nanostructured copolymer material with heavy metal ions and imaging the nanostructured copolymer material-heavy metals complexes using microscopy techniques known in the art. In some embodiments, the characteristics of the nanostructured copolymer material-heavy metals complexes can be analyzed and correlated to the degree of dehydration of the PVA material and to the efficiency of the nanostructured copolymer material.

In some embodiments, the nanostructured copolymer material can have light polarizing properties, absorbing one component of the light wave and transmitting another component of the light wave, thereby producing polarized light. As used herein, the term "light" is defined broadly so as to also include wavelengths beyond the visible range of 400-800 nm, that is, so as to include ultraviolet of 200-400 nm and infrared of 800-2000 nm wavelengths. Due to the random length of the PA polymer blocks in the PVA-PA copolymer, the nanostructured copolymer material can respond to different wavelengths of light. For example, the nanostructured copolymer material can absorb different light frequencies such visible, infrared (IR) or as ultraviolet (UV) depending on the length distribution of the PA sections, and the length of the PVA sections, which host the polarized ionic dipoles, which we call diodes.

In some embodiments, the nanostructured copolymer material can be a light polarizing and conductive thin film. Typical active film thicknesses range from about 1 μm to about 10 μm. The thin film can be formed by a plurality of chains deposited on top of one another. Preferably, the thin film comprises a ratio of polyacetylene to poly(vinyl) alcohol such as the structural integrity is maintained and to allow for photons absorption and for a conductivity of at least 1 S/cm.
Devices Some aspects of the invention relate to copolymer photoelectric devices 30 or solar cell, a manufacturing method thereof and a method of converting light beam to electric current. According to some aspects of the invention, and referring to FIG. 6, there is provided a thin photoelectric device 30 comprising a polarizing copolymer thin film 20, a support layer 34 and at least two electrodes 32. The polarizing thin film 20 comprises a PVA-PA copolymer with an absorption spectrum matching the solar emission spectrum. Preferably, the thin film 20 comprises a ratio of polyacetylene to poly(vinyl alcohol) such as the thin film allows for light polarization, for photons absorption, and for a conductivity of at least 1 S/cm. Typical active layer film thicknesses range from about 1 μm to about 10 μm. Although the active film thicknesses are not critical, device performance can typically be improved by using thinner films rather than thicker films. In some embodiments, the film thickness optimally should be adjusted to an optical density such that light 36, for example visible light, is absorbed and polarized throughout the film thickness. In some embodiments, the thickness of the film 20 can vary depending on the application.

In some embodiments, the thin film 20 can be laid down on a support 34 using any of the known thin-film forming processes. Various materials may be used as supports, such as glass or polyester film. The substrate 34 is preferably non-conducting. It can be a rigid inorganic material such as a rigid glass or a flexible or rigid organic polymer such as polyester, for example, poly(ethylene terephthalate), flexible polycarbonate, flexible polystyrene-block-poly(ethylene-ran-butylene)-block-polystyrene thermoplastic elastomer, glassy poly (methylmethacrylate), glassy polystyrene and the like. The term "transparent" as used herein refers to the property of a material of transmitting a substantial portion (i.e., at least about 50%) of a given wavelength of light impinging upon it. The thickness of the support 34 may not be critical so long as it can accomplish its supporting function. Thicknesses of a few microns to a millimeter or more may be used.

In some embodiments, and referring to FIG. 5, the device 30 comprises at least two interdigitated electrodes 22 which can carry the photon induced electrical current to be summed on bus bars 24. One skilled in the art will appreciate that the efficiency of the device depends on the arrangement and separation between the electrodes 22. In some embodiments, the electrodes 22 are spaced apart so as to achieve the desired efficiency or to increase the efficiency of the device 20. Referring to FIG. 6, the electrodes 32 can be mounted or printed onto the support 34. The electrodes 32, in some embodiments, can be mounted between the support 34 and the thin film 20. Yet, in other embodiments, the electrodes 32 can be positioned on top of the film 20. The electrodes 32 can be from a transparent conductor such as transparent conducting oxide (TCO).

In some aspects, the device of the invention can be used as a photovoltaic device. The thin film 20 can act as a polarizing layer to absorb part of the incident light 36 and let the other part pass through. Photons can be captured by the polyacetylene polymers (also referred as antennae) within the thin film and 20 can induce an electrical current that can be summed on the bus bars 24. In some embodiments, the other part of the incident light can pass through the thin film 20 and the transparent substrate 34. In some embodiments, the device can have a reflective surface to direct the polarized light back to the polarizing thin film.

Applications

Macroscale structures may be made from the thin film of the present invention having aligned copolymer chains. For example, in photoelectric applications, thin films may be used as materials in solar cells, solar modules, building integrated photovoltaic devices, printing electronic circuits, organic light emitting diodes, biosensors, electrochemical systems, or microelectronic devices.

Chains and bundles of chains made from synthesized copolymer of the present invention, especially those with copolymer chains preferentially aligned along the axis of the fibril, may be incorporated in a fabric.

While the invention has been described in connection with the specific embodiments thereof, it will be understood that it is capable of further modification. Furthermore, this application is intended to cover any variations, uses, or adaptations of the invention, including such departures from the present disclosure as come within known or customary practice in the art to which the invention pertains.

The invention claimed is:

1. A conductive fibril bundle comprising:
   a plurality of conductive chains situated substantially parallel to one another, each having a plurality of conductive polyacetylene polymer blocks and a plurality of polar poly(vinyl alcohol) polymer blocks positioned along the chain forming a pattern of alternatively repeating polyacetylene polymer blocks and poly(vinyl alcohol) polymer blocks to permit electrical conductivity along the chain;
   a plurality of links formed by aggregation of the poly(vinyl alcohol) polymers on one chain to the poly(vinyl alcohol) polymers on an adjacent chain; and
   a ratio of polyacetylene polymer to poly(vinyl alcohol) polymer to provide the conductive fibril bundle with a conductivity of at least 1 S/cm.

2. The conductive fibril bundle of claim 1 further comprising iodine.

3. The conductive fibril bundle of claim 1 wherein the plurality of conductive chains are used to convert light energy to electrical energy.

4. A conductive thin film comprising:
   a member having opposing surfaces;
   a plurality of chains embedded within the member and being substantially parallel to one another, each conductive chain having (i) a plurality of conductive polyacetylene polymer blocks and a plurality of polar poly(vinyl alcohol) polymer blocks along the chain forming a pattern of alternatively repeating polyacetylene polymer blocks and poly(vinyl alcohol) polymer blocks to permit electrical conductivity along the chain, and (ii) a plurality of links formed by aggregation of the poly(vinyl alcohol) polymers on one chain to the poly(vinyl alcohol) polymers on another chain; and
   a ratio of polyacetylene polymer to poly(vinyl alcohol) polymer to provide the member with sufficient structural integrity while allowing for a conductivity of at least 1 S/cm.

5. The conductive thin film of claim 4 wherein the plurality of polyacetylene polymer blocks has a length of at least 10 Å.

6. The conductive thin film of claim 4 wherein the thin film has a conductivity of at least 1 S/cm.

7. The conductive thin film of claim 4 further comprising iodine.

8. The conductive thin film of claim 4 wherein in the pattern the length of the polyacetylene polymer blocks and the length of the poly(vinyl alcohol) polymer blocks are random.

9. The conductive thin film of claim 4 further comprising islands of oriented ionic dipoles, the islands of oriented ionic dipoles being spaced at least 10 Å apart.

10. The conductive thin film of claim 9 wherein the oriented ionic dipoles have an anionic group, and a cationic group.

* * * * *